United States Patent
Lee et al.

(10) Patent No.: US 7,046,516 B2
(45) Date of Patent: May 16, 2006

(54) CLIP FOR HEAT SINK

(75) Inventors: Hsieh-Kun Lee, Tu-Cheng (TW); Cui-Jun Lu, Shenzhen (CN); Ling-Bo Cao Cao, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 65 days.

(21) Appl. No.: 10/975,575

(22) Filed: Oct. 28, 2004

(65) Prior Publication Data

US 2005/0111193 A1 May 26, 2005

(30) Foreign Application Priority Data

Nov. 21, 2003 (TW) .............................. 92220599 U

(51) Int. Cl.
*H05K 7/20* (2006.01)
(52) U.S. Cl. .................. 361/704; 361/719; 257/719; 165/80.3; 24/458
(58) Field of Classification Search ............. 361/687, 361/702, 703, 704, 709–712, 717–719; 257/718, 257/719, 726, 727; 174/16.3; 165/80.2, 165/80.3, 121–126, 185; 29/557, 890.03; 24/294–297, 453, 457, 458, 625; 248/505, 248/510
See application file for complete search history.

(56) References Cited

U.S. PATENT DOCUMENTS

| 6,061,239 | A | 5/2000 | Blomquist | |
|---|---|---|---|---|
| 6,082,440 | A | 7/2000 | Clemens et al. | |
| 6,181,559 | B1 | 1/2001 | Seo | |
| 6,205,026 | B1 | 3/2001 | Wong et al. | |
| 6,418,022 | B1 * | 7/2002 | Chen | 361/704 |
| 6,421,242 | B1 * | 7/2002 | Chen | 361/704 |
| 6,449,157 | B1 * | 9/2002 | Chu | 361/704 |
| 6,473,306 | B1 * | 10/2002 | Koseki et al. | 361/704 |
| 6,522,545 | B1 | 2/2003 | Shina et al. | |
| 6,542,367 | B1 * | 4/2003 | Shia et al. | 361/703 |
| 6,640,884 | B1 * | 11/2003 | Liu | 165/80.3 |
| 6,826,051 | B1 * | 11/2004 | Lai et al. | 361/704 |

* cited by examiner

*Primary Examiner*—Michael Datskovskiy
(74) *Attorney, Agent, or Firm*—Morris Manning & Martin; Tim Tingkang Xia, Esq.

(57) ABSTRACT

A clip for heat sink comprises an inverted T-shaped retaining member and an L-shaped operation member pivotably connected to the retaining member. The retaining member has a detaining portion defining several openings and a connecting portion extending from the detaining portion. The operation member has a press portion for bearing against the heat sink and a holding portion for being grasped extending from the press portion. The operation member is capable of being driven to rotate from a first position to a second position to cause the detaining portion to interlock with a retention module provided on a printed circuit board, thereby securing the heat sink to an electronic element package on the printed circuit board.

18 Claims, 4 Drawing Sheets

CLIP FOR HEAT SINK

BACKGROUND OF THE INVENTION

1. Technical Field

The present invention generally relates to a securing device, and particularly relates to a clip for attaching a heat sink to an electronic element package for heat dissipation.

2. Related Art

Development of integrated circuit technology has resulted in the enhanced density of very large scale integrated circuits (VLSI) in electronic element packages, such as a central processing unit (CPU). The electronic element package operates at a very high speed. The faster the electronic element package runs, the more it generates heat. The heat generated by the electronic element package not to be removed away in time will lead to an increase of temperature of the electronic element package and result in instability of operation of the electronic element package and occurrence of functional obstacle. Therefore, how to dissipate heat fast and effectively has become a problem that must be resolved before a CPU is applied.

In order to remove the heat generated by the electronic element package, a heat sink is applied to assist dissipating heat, and a clip is used to fasten the heat sink to the electronic element package tightly. The earliest method of securing a heat sink is to use several screws traveling through a printed circuit board (PCB) and the heat sink to couple the heat sink and the electronic element package installed on the PCB. However it is distinctly inconvenient to use screws to mount or remove the heat sink. On the other hand, an accessory tool is needed which results in mounting or removal of the heat sink complicated. Furthermore, it is difficult to keep the contacting forces between the heat sink and the PCB at the positions where the screws are located equivalent to cause the heat sink to intimately contact the electronic element package. The method of using screws is out of application bit by bit. A wire clip has been consequently applied. A wire clip is generally made by bending an elastic metal wire to form a Z-shaped clip with a middle press portion and two clamping arms extending from the press portion. In use, the press portion of the wire clip bears against the heat sink and the clamping arms clamp protrusions of a socket connector on the PCB. However, it is inconvenient to hold the slim elastic hook in use. So, it is not widely used.

A clip in common use at present is illustrated in FIG. 4. The clip includes a body 100 and a hanger 200. The body 100 comprises an elongated curved press portion 120 and a clamping portion 140 extending downwardly from one end of the press portion 120. The hanger 200 is hanged to the other end of the press portion. Two openings 160, 240 for engaging protrusions (not shown) on a socket connector are respectively defined in the clamping portion 140 of the body 100 and the hanger 200. It is an improvement in contrast with the above-mentioned screws and the wire clip. However, it is difficult to engage the hanger 200 with the socket connector after clamping portion 140 engages with the socket connector. Moreover, the hanger 200 is still inconvenient to be held. On the other hand, the clip is mostly located in a groove between two adjacent fins in the middle of the heat sink for preventing the heat sink from moving in a horizontal direction. The groove for receiving the clip occupies the space of the heat sink which would otherwise be occupied by heat dissipating fins. Thus, the clip reduces the heat dissipating surface area of the heat sink and therefore decreases the heat dissipating efficiency of the heat sink.

Along with the continuing development of integrated circuit technology, the size of heat sink is becoming larger and larger corresponding to the continuing increase of heat generated by electronic element package. A larger force is required to be exerted to a heat sink for ensuring firm contact between the heat sink and an integrated circuit package. How to mount firmly and conveniently a large dimension heat sink to a PCB by a small operation force becomes a problem which needs overcoming.

Thus, an improved clip which overcomes the above-mentioned problem is desired.

SUMMARY OF THE INVENTION

Accordingly, an object of the present invention is to provide a clip which can exert balanced forces to a heat sink mounted on an electronic element package.

Another object of the present invention is to provide a clip which can mount a heat sink to an electronic element package conveniently.

To achieve the above-mentioned objects, a clip for heat sink is applicated. The clip comprises an inverted T-shaped retaining member and an L-shaped operation member pivotably connected to the retaining member. The retaining member has a detaining portion with several openings and a connecting portion extending from the detaining portion. The operation member has a press portion for bearing against the heat sink and a holding portion for being grasped extending from the press portion. The operation member is capable of being driven to rotate from a first position to a second position to cause the detaining portion to interlock with a retention module provided on a printed circuit board, thereby securing the heat sink to an electronic element package on the printed circuit board.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
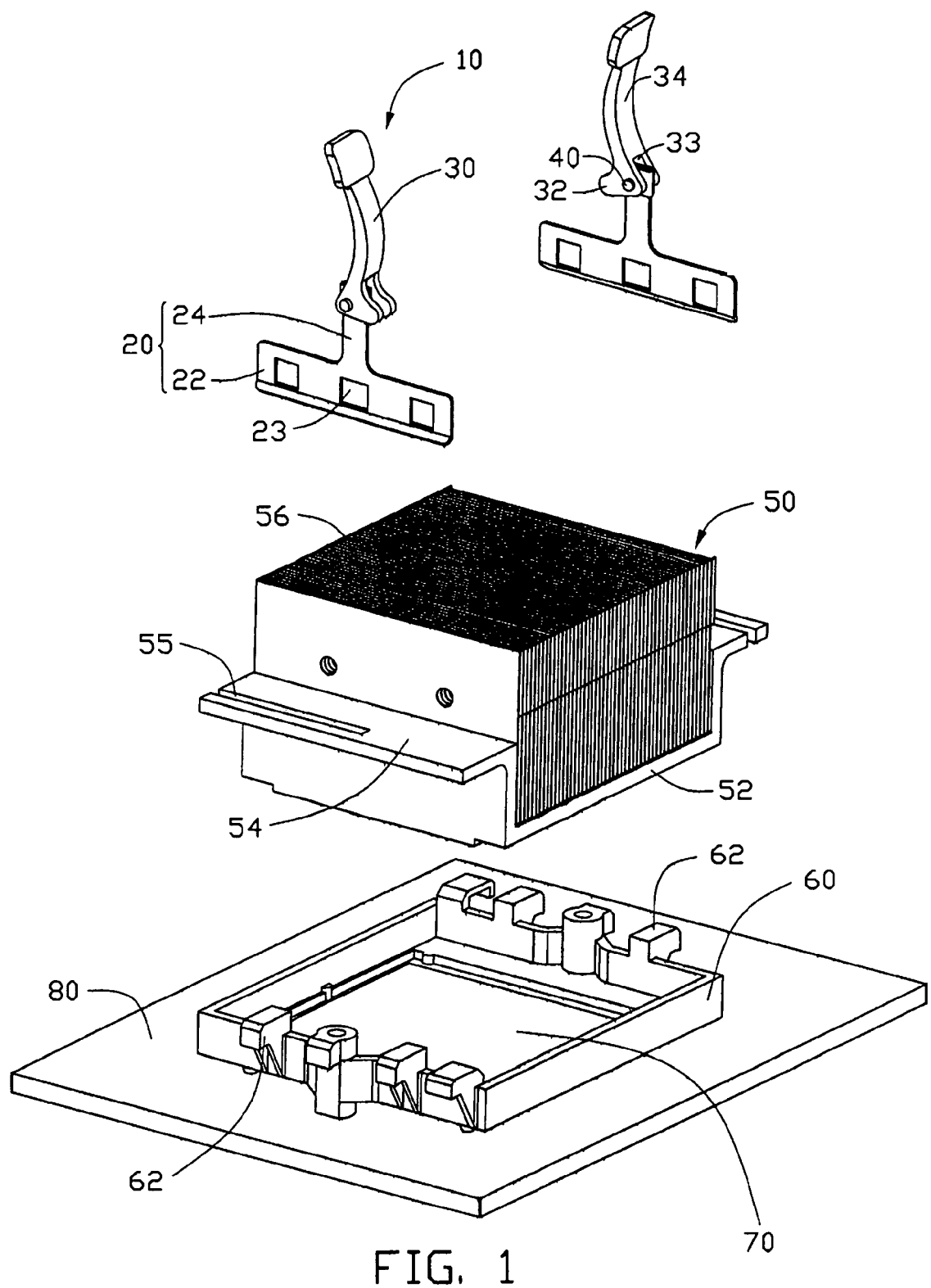
FIG. 1 is an exploded isometric view of the clip and related element of the present invention.

FIG. 1 shows a pair of clips 10 in accordance with the present invention for mounting a heat sink 50 to an electronic element package 70 which is mounted on a printed circuit board 80 (PCB). A retention module 60 is mounted on the PCB 80 surrounding the electronic element package 70.

The retention module 60 is a rectangle frame provided with several protrusions 62 protruding outwardly and downwardly from opposite sides thereof.

The heat sink 50 is made of heat conductive metal and has a U-shaped base (not labeled) for contacting with the electronic element package 70. The base comprises a horizontal portion 52 on which a plurality of fins 56 is formed and two upright portions (not labeled) extending upwardly from opposite sides of the horizontal portion 52. Two platforms 54 extend horizontally and outwardly from the top edges of the upright portions respectively. The two platforms 54 define a pair of parallel slots 55 extending toward each other from two opposite edges of the two platforms 54. Each slot 55 has an open end and a close end in the middle of the corresponding platform 54 of the heat sink.

Figure 2:
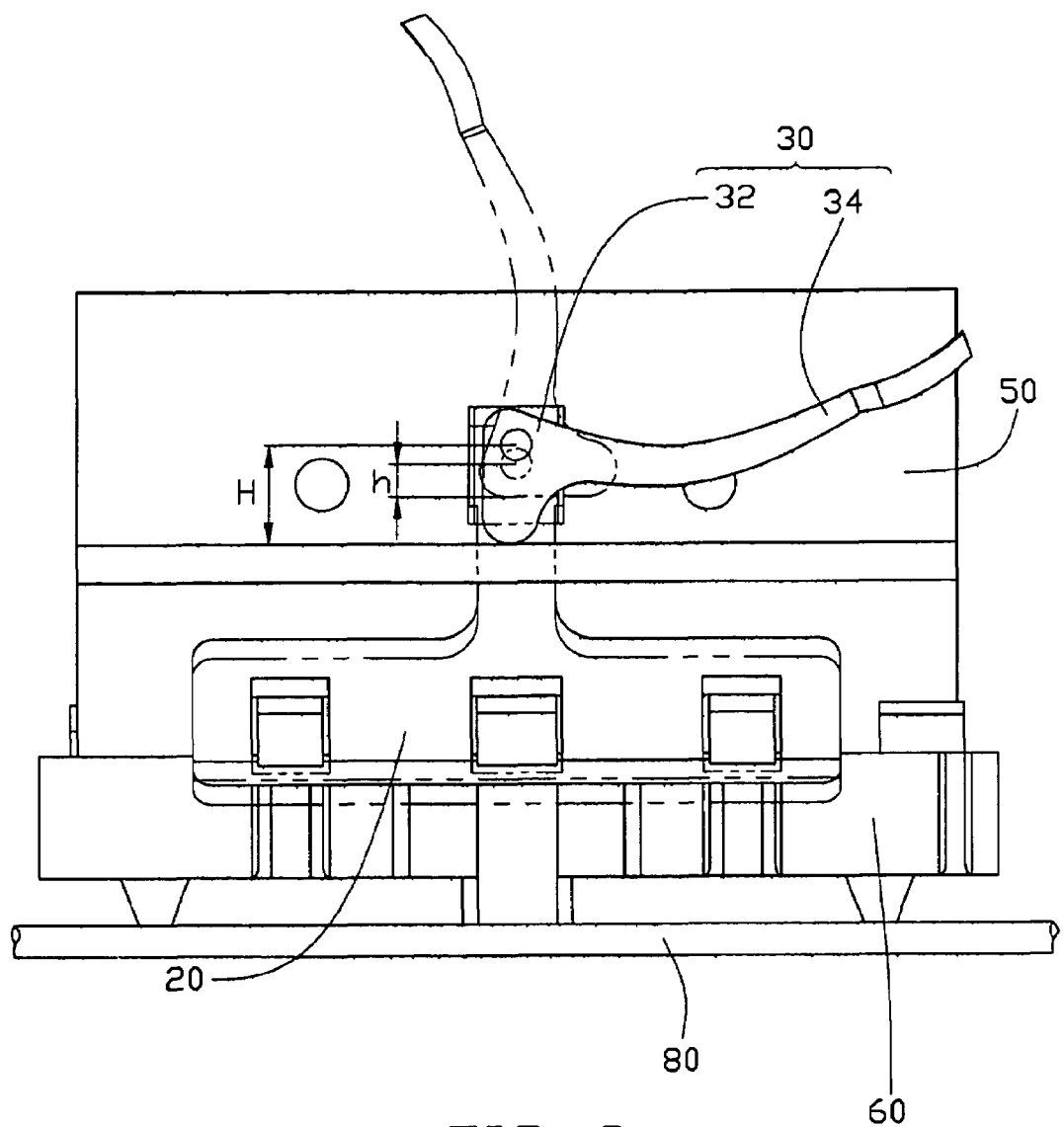
FIG. 2 is a sketch front elevational view of FIG. 1 during assembly.

The clip 10 is composed of an inverted T-shaped retaining member 20 and an L-shaped operation member 30. The retaining member 20 has a detaining portion 22 stretching in a first direction and defines several openings 23 for engaging with the protrusions 62 of the retention module 60, and a connecting portion 24 extending from the substantially middle portion of the detaining portion 22 in a second direction substantially particular to the first direction. The L-shaped operation member 30 has a short press portion 32 and a long holding portion 34 extending from the press portion 32. The press portion 32 has a cam-shaped free end on which a mouth 33 is defined. The connecting portion 24 of the retaining member 20 is received in the mouth 33 and pivotably connected with the operation member 30 by a shaft 40 at a junction point above the detaining portion 22. Referring to FIG. 2, the operation member 30 is rotatable around the shaft 40 between a first position and a second position. Please refer to FIG. 1 together, when driving the operation member 30 to rotate around the shaft 40 from the first position to the second position, the distance in the second direction between the farthest point of the press portion 32 relative to the junction point in the second direction and the junction point varies accordingly. The minimum h of the distance appears when the operation member 30 is disposed at the first position and the maximum H of that arises when the operation member 30 is disposed at the second position. The distance varies from h to H during the operation member 30 rotating from the first position to the second position. The distance will diminish appreciably when the operation member 30 continues to rotate after passing the second position. Alternatively, the operation member 30 is L shape without a cam-shaped free end, and further alternatively, the operation member 30 is not an L shape but has a cam-shaped free end.

Figure 3:
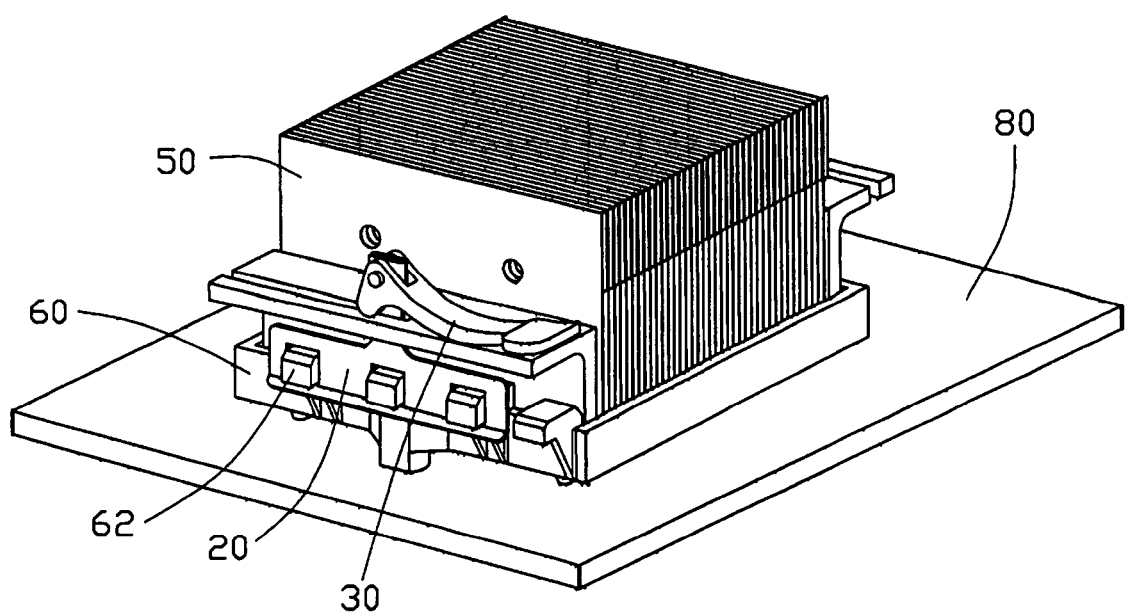
FIG. 3 is a fully assembled view of FIG. 1.
Figure 4:
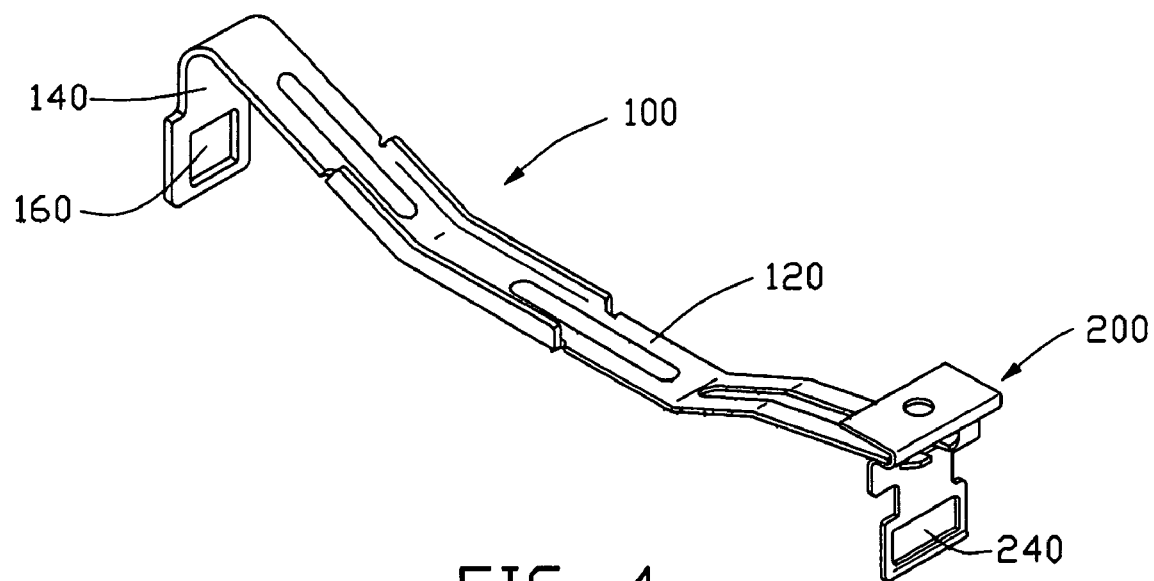
FIG. 4 is an isometric view of a conventional clip.

Further referring to FIG. 3 in accompany with FIG. 1 and FIG. 2, before mounting the heat sink 50, the clips 10 are attached to the heat sink 50 via the connecting portion 24 of each retaining member 20 entering from the open end of the slot 55 to the close end thereof and received in the slot 55 of the corresponding platform 54 of the heat sink 50, and the operation members 30 are supported by the platforms 54 and disposed at the first position. At that time, the operation member 30 is located at a loose position and the press portion 32 contacts loosely with the platform 54. The heat sink 50 with the clips 10 is placed in the retention module 60. The slots 55 are over the protrusions 62 of the retention module 60 with the close end of each slot 55 located over the middle one of the protrusions 62 and the openings 23 of the retaining members 20 of the clips 10 align with the corresponding protrusions 62 of the retention module 60. The operation member 30 is driven via operation on the holding portion 34 to rotate the operation member 30 from the first position to the second position. Accordingly, the distance in the second direction between the junction point and the farthest point of the press portion 32 of the operation member 30 relative to the junction point in the second direction increases from h to H, which results in the retaining member 20 moving upwardly. The openings 23 of the detaining portion 22 of the retaining member 20 are therefore tightly engaged with the protrusions 62 of the retention module 60 and the press portion 32 of the operation member 30 bears against the platform 54 of the heat sink 50 downwardly to cause the base 52 of the heat sink 50 to intimately contact the electronic element package 70. A maximum bearing force is exerted downwardly onto the heat sink 50 when the operation member 30 is deposed at the second position. The operation member 30 continues to rotate to a locked position. Referring to FIG. 3, at the locked position, the holding portion 34 and the press portion 32 bear against the platform 54 of the heat sink 50 on opposite sides of the junction point between the retaining member 20 and the operation member 30, and the operation member 30 is not easy to be reversed by a small undesired accidental force. Thus, the heat sink 50 is mounted firmly to the electronic element package 70 by two balanced forces respectively exerted on the platforms 54 of the heat sink 50.

When removing the heat sink 50, the operation member 30 is driven to rotate from the locked position to the loose position to release the retaining member 20 from the protrusions 62. The retaining member 20 is then removed away from the protrusions 62 of the retention module 60. After that, the heat sink 50 together with the clips 10 can be easily taken out of the retention module 60.

It is obvious that the heat sink 50 can be easily mounted by a small operation force and also can be removed conveniently by an operation of rotating the operation member.

It is recognized that the invention may be susceptible to various other modifications and alternative constructions in view of this disclosure. Although the invention has been shown and described in detail herein by a preferred embodiment and certain alternatives, it should be understood that there is no intention of limiting the invention strictly to this. But rather it is the intention to cover all such other modifications and alternative constructions falling within the spirit and scope of the invention as defined in the appended claims.

What is claimed is:

1. A clip for a heat sink comprising:
   a retaining member having a detaining portion stretching in a first direction and a connecting portion extending from the detaining portion in a second direction substantially perpendicular to the first direction;
   an operation member pivotably connected to the connecting portion of the retaining member at a junction point above the detaining portion and being pivotable from a first position to a second position, the operation member comprising a press portion adapted for bearing against the heat sink;
   wherein the distance in the second direction between the junction point and the farthest point of the press portion relative to the junction point in the second direction is variable when the operation member pivots from the first position to the second position.

2. The clip as claimed in claim 1, wherein the retaining member has a substantially inverted T shape.

3. The clip as claimed in claim 2, wherein several openings are defined in the detaining portion.

4. The clip as claimed in claim 1, wherein the operation member has a substantially L shape and further comprises a holding portion extending from the press portion.

5. The clip as claimed in claim 1, wherein the press portion has a cam-shaped free end.

6. The clip as claimed in claim 5, wherein a mouth for receiving the connecting portion is defined in the press portion.

7. A heat sink assembly for dissipating heat generated by an electronic element on a printed circuit board comprising:
   a retention module mounted on the printed circuit board around the electronic element and provided with a plurality of protrusions;

a heat sink adapted for contacting the electronic element and including a pair of platforms at opposite sides thereof and a plurality of fins provided between the platforms; and a pair of clips mounted to the heat sink, each clip including a retaining member having a detaining portion for engaging with the protrusions of the retention module below one of the platforms of the heat sink and a connecting portion extending upwardly from the detaining portion through said platform of the heat sink, and an operation member having a press portion resting on said platform of the heat sink and a holding portion extending from the press portion, the operation member being pivotably connected to the connecting portion above the platform of the heat sink and being pivotable from a loose position at which the press portion releases the platform of the heat sink to a locked position at which the press portion bears against the platform of the heat sink.

8. The heat sink assembly as claimed in claim 7, the holding portion of the operation member bears against the platform at the locked position.

9. The heat sink assembly as claimed in claim 7, wherein several openings are defined in the detaining portion of the retaining member of the clip.

10. The heat sink assembly as claimed in claim 7, wherein the press portion has a cam-shaped free end.

11. The heat sink assembly as claimed in claim 7, wherein the retaining member is substantially in the form of inverted T.

12. The heat sink assembly as claimed in claim 7, wherein the operation member is substantially in the form of L.

13. The heat sink assembly as claimed in claim 12, wherein the operation member is connected to the retaining member at the junction of the press portion and the holding portion.

14. The heat sink assembly as claimed in claim 7, wherein each of the platforms defines a slot for extension of the connecting portion of the retaining member.

15. The heat sink assembly as claimed in claim 14, the pair of slots extend each other from two opposite edges of the pair of platforms.

16. The heat sink assembly as claimed in claim 7, wherein the detaining portion of the retaining member is driven to move toward the platform to thereby engage with the protrusions of the retention module when the operation member is pivoted from the loose position to the locked position.

17. A securing device for a heat sink securely attachable to a heat-generating electronic element having a retention module disposed around said element and moving coincidently with said element, comprising:

a retaining member having a detaining portion securely attachable to said retention module and a connecting portion extending through said heat sink; and an operation member pivotably connected to said connecting portion of said retaining member at an extending end of said connecting portion, said operation member comprising a press portion and a holding portion extending respectively from a pivotably connected portion of said operation member, both of said press portion and holding portion rotatable from a position of being capable of being away from said heat sink to another position of engaging forcedly with said heat sink so as to provide an significantly contact force between said heat sink and said element via attachment of said detaining portion to said retention module at said another position of said press portion and holding portion.

18. The securing device as claimed in claim 17, wherein said detaining portion of said retaining member has at least three openings to attach to corresponding protrusions symmetrically formed on a side of said retention module.

* * * * *